(12) United States Patent
Mearini et al.

(10) Patent No.: US 7,195,797 B2
(45) Date of Patent: Mar. 27, 2007

(54) HIGH THROUGHPUT HIGH-YIELD VACUUM DEPOSITION SYSTEM

(75) Inventors: Gerald T. Mearini, Shaker Heights, OH (US); Laszlo Takacs, Shaker Heights, OH (US)

(73) Assignee: Atomic Telecom, Cleveland, OH (US)

( * ) Notice: Subject to any disclaimer, the term of this patent is extended or adjusted under 35 U.S.C. 154(b) by 192 days.

(21) Appl. No.: 09/902,250

(22) Filed: Jul. 10, 2001

(65) Prior Publication Data

US 2002/0012746 A1 Jan. 31, 2002

Related U.S. Application Data

(60) Provisional application No. 60/217,060, filed on Jul. 10, 2000, provisional application No. 60/217,115, filed on Jul. 10, 2000.

(51) Int. Cl.
*C23C 16/00* (2006.01)
(52) U.S. Cl. .............. 427/248.1; 427/250; 427/523; 427/566; 427/581; 427/585
(58) Field of Classification Search .......... 427/569, 427/570, 573, 581, 582, 585, 566, 523, 248.1, 427/250; 247/248.1, 250
See application file for complete search history.

(56) References Cited

U.S. PATENT DOCUMENTS

| 4,101,925 | A | * | 7/1978 | Kelley et al. ............... 257/741 |
| 4,747,922 | A | | 5/1988 | Sharp ................... 204/192.11 |
| 4,842,893 | A | * | 6/1989 | Yializis et al. .............. 427/497 |
| 5,529,671 | A | * | 6/1996 | Debley et al. ........ 204/192.34 |
| 5,725,413 | A | | 3/1998 | Malshe et al. ............... 451/41 |
| 5,748,350 | A | | 5/1998 | Pan et al. ................... 359/130 |
| 6,205,270 | B1 | | 3/2001 | Cao ........................... 385/24 |
| 6,233,261 | B1 | | 5/2001 | Mesh et al. .................... 372/32 |

OTHER PUBLICATIONS

Kumar, et al.; *Near-Infrared Bandpass Filter from Si/SiO₂; Multilayer Coatings*; Feb 1999.
Suntola, T.; *Cost-Effective Processing by Atomic Layer Epitaxy;*. 1993.
Bachman, et al.; *Molecular Layer Expitaxy by Real-Time Optical Process Monitoring*; Department of Materials Science and Engineering, North Carolina State University, 1997.
H., Kawai, T. Tabata; *Atomic Layer Control of the Growth of Oxide Superconductors Using Laser Molecular Beam Epitaxy*; 1997.

(Continued)

*Primary Examiner*—Alain L. Bashore
(74) *Attorney, Agent, or Firm*—Duane Morris, LLP

(57) ABSTRACT

A vacuum deposition system has been designed to produce thin film based demultiplexers with high throughput and production yields of greater than 25% for use in Dense Wavelength Division Multiplexer (DWDM) systems. The system employs a dense array of high yield fixtures and an ion assisted movable dual electron beam evaporation system. The fixture array increases acceptable yields of narrow band pass filters to 25–75% compared to less than 5% in conventional coating systems used for DWDM. The movable e-beam system allows critical symmetry to be maintained while eliminating significant delays resulting from deposition of two materials from a single electron gun. The vacuum deposition system will enable production of more than 15,000 50–200 GHZ filters which meet specifications for DWDM demultiplexers every 48 hours.

17 Claims, 4 Drawing Sheets

OTHER PUBLICATIONS

Spiller, E;*Smoothing of Multilayer X-Ray Mirrors by Ion Polishing*; IBM Research Division, Thomas J. Watson; 1993.
Puik, E.J, van der Wiel and Zeijlemaker, H, and Verhoeven, J.; *Ion Etching of Thin W Layers: Enhancing Reflectivity of W-C Multilayer Coatings*; Mar. 30, 1989.
Nishizawa, J., Abe, H., and Kurabayshi, T.*J.* 132 (5) (1985).
Puik, E.J., et al.; *Appln. Surf. Sci.* 47 (1991) 251.
Kloidt, A, et al.; *Thin Sol Films*, 228 (1993) 154.
Imai, F., Kunimori, K., and Nozoye, H; *Novel Epitaxial Growth Mechanism of Magesium Oxide/Titanium Oxide Ceramics Superlattice Thin Films Observed by Reflection High-Energy Electron Diffraction*; Nov. 8, 1993.
Kildemo, et al.; *Real Time Control of the Growth of Silicon Alloy Multiwavelength Ellipsometry*; 1996.

* cited by examiner

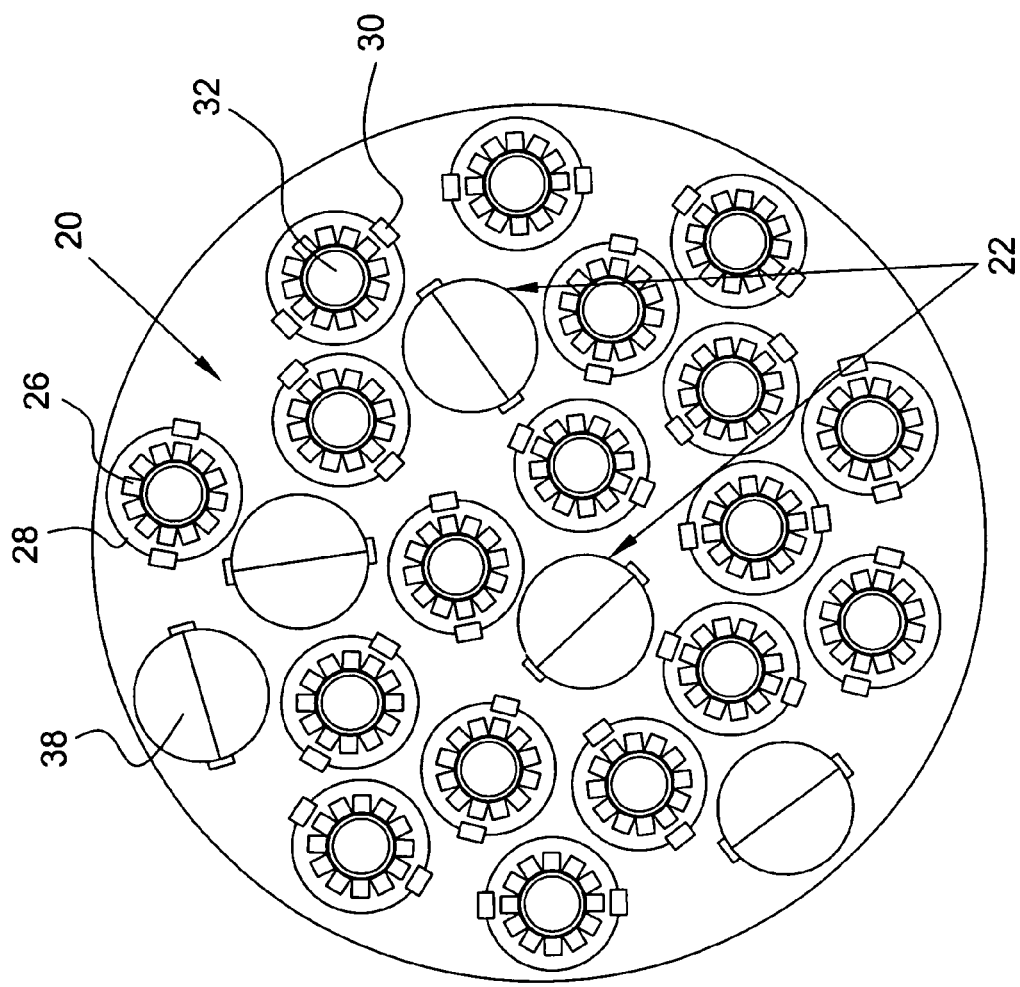

HIGH THROUGHPUT HIGH-YIELD VACUUM DEPOSITION SYSTEM

This application claims priority to U.S. Provisional patent application Ser. No. 60/217,060, entitled HIGH THROUGHPUT HIGH-YIELD VACUUM DEPOSITION SYSTEM FOR THIN FILM BASED DENSE WAVELENGTH DIVISION MULTIPLEXERS, filed on Jul. 10, 2000 and U.S. Provisional patent application Ser. No. 60/217,115, entitled SUBSTRATE FIXTURE FOR HIGH-YIELD PRODUCTION OF THIN FILM BASED DENSE WAVELENGTH DIVISION MULTIPLEXERS, filed on Jul. 10, 2000.

I. BACKGROUND OF THE INVENTION

A. Field of the Invention

In at least one aspect, the present invention relates to film deposition useful in the installation of a worldwide fiber-optic network, which is in progress, capable of handling levels of data transmission inconceivable only several years ago. As a result of this network, the Internet is less than half a decade away from being a more useful tool than the computers which navigate it. Advanced thin film coatings have emerged as the enabling technology to control transmission and reflection of selected wavelengths of light. From this, and other technical achievements, existing optical fibers will accommodate the increase in bandwidth that is required over the next 3–5 years.

Dense Wavelength Division Multiplexer (DWDM) systems enable information to be delivered inside fiber-optic cables at multiple wavelengths. The increase in the bandwidth is limited only by the number of wavelengths which can be superimposed on the fiber. Current state-of-the-art DWDM can multiplex/demultiplex approximately 40 channels. Ultimately more than 1000 channels will be possible. During transmission, information is packaged within pulse modulated carriers at specific wavelengths and superimposed (multiplexing) on the fiber. During reception, the carriers must be separated (demultiplexing). Optical component technology such as DWDM is critical in order to achieve the bandwidth necessary for future interactive services, such as "video on demand," and has prompted multi-billion dollar strategic acquisitions such as OCLI®, NetOptix™, and XROS™.

The most widely used technology for demultiplexing in DWDM systems is thin film-based. Multilayered, thin dielectric coatings are comprised of 150–200 layers with individual optical layer thickness equal to multiples of ¼ of the wavelength to be transmitted (known as dielectric interference filters.) A collection of such filters, coupled together, each differing slightly in design to allow light transmission of different wavelengths, and "connected" to a fiber-optic cable, enables the multiplexing (superposition) and demultiplexing (separation) of multiple wavelengths of laser light containing digital information.

Current thin film demultiplexer filters are produced with accepted yields of less than 5%, due to the complexity and uniformity requirements of the filter designs. Coating equipment used for complex optical coatings are not optimally tooled to provide necessary uniformity for this application, and are therefore unable to produce a high throughput of certified filters. A large-area, ion assisted, electron-beam evaporation system has been designed which utilizes a novel fixture assembly resulting in a substantial improvement in yields. The system employs several modifications to conventional deposition configurations and processes to enable high throughput of narrow band pass filters for multiplexers (muxes) and demulitplexers (demuxes) in DWDM systems.

B. Description of the Related Art

Thin film coatings designed to permit light transmission/reflection over narrow (0.1–25 mm) and broad (>25 mm) band passes are typically comprised of multiple layers of two or more optically matched "high" index and "low" index materials. The individual layer thickness and number of layers will ultimately define the optical performance of the filter. Typical "high performance" narrow band filters may have more than 100 individual layers.

High performance dielectric thin film optical filters are produced in volume for state-of-the-art muxes and demuxes used in DWDM systems. These filters are produced with materials such as $SiO_2$ and $Ta2O_5$ deposited with processes such as ion beam sputter deposition (ISBD) and ion-assisted deposition (IAD). Filters produced with these processes are stable under adverse environmental conditions.

Thickness uniformity is critical in any optical filter application. Optical coating systems are typically designed to produce coatings with thickness uniformity of approximately 0.1% variation over the substrate area. This level of thickness control is insufficient for multilayered coatings designed for DWDM. Layer thickness determines wavelength and amplitude (loss) of transmitted light, therefore, accurate thickness determination and reproducibility are crucial.

In practice, tens of substrates (approximately 6" square) are coated with multilayer filters designed for DWDM in "traditional" IBSD or IAD systems. A typical IAD production coating system can be approximated by a 60" cube with a fixture assembly located at the top of the vacuum chamber as shown schematically in FIG. 1A. The planetary fixture assembly 34 is designed for thickness uniformity described above and can accommodate approximately sixteen (16) to twenty-four (24) 6" square or round substrates. As many as five QCMs (quartz crystal monitors) and an optical monitor are positioned about the chamber to monitor deposition rate and optical layer thickness. The quartz monitors are calibrated prior to production. Deposition rate incident on the substrate assembly is determined by sampling each monitor and averaging.

Two or three electron guns are employed to reduce the deposition time as shown in FIG. 1A. The filter is comprised of more than 150 alternating layers, and the source material must be preheated before each layer is deposited. The preheating process can take from 30–120 seconds (0.5–2.0 minutes) which would add up to (0.5–2.0)×150=75–300 additional minutes to the deposition cycle if a single gun was used.

The substrates are diced into thousands of ~1 mm squares (called dies or chips). Every coated die is tested for performance to determine which ones, if any, meet requirements. Major manufacturers such as OCLI® have reported production yields of less than 5%. The demand for such filters is approaching 1 million per month. This demand will not be met with the current system configurations without a significant increase in capital equipment to increase capacity. Customers for the filters have relaxed requirements and settled for inadequate performance to continue with installation of DWDM systems A patent pending high yield fixture, called the Vornado™, has been designed to produce demux filters for DWDM systems with greater than 25% accepted yield. The design is comprised of a disk (approximately 8.5" in diameter) with a concentric multi crystal QCM and a dedicated "clam" shutter arrangement. The disk rotates at greater than 1000 rpm during operation to insure uniform deposition of material at typical coating deposition rates of 0.2–0.5 nm/s. The Vornado™ is capable of yielding approximately 1000 filters per deposition.

II. SUMMARY OF THE INVENTION

A vacuum deposition system has been designed that in one embodiment may be used for production of narrow band pass filters for use in mux and demux devices of DWDM systems. The filter production system may utilize a high-yield fixture assembly such as the Vornado™ and a novel moving electron gun assembly which in one embodiment allows symmetry between the substrates and deposition source to be maintained. With proper system calibration, and modifications to conventional vacuum deposition processes used to produce filters for DWDM components, the system is capable of yields greater than 25% and a production capacity of greater than 15,000 filters per deposition.

In accordance with one aspect of the present invention, an ion-assisted electron beam evaporation process includes the steps of positioning multiple high yield fixtures in an array, adjusting a vertical position of each of the fixtures to compensate for variations in deposition rate versus chamber location, providing two electron guns, mounting the guns to a movable track, positioning the first gun at a source deposition location, rotating the fixture at greater than 2400 revolutions per minute, performing ion assisted evaporation with the first gun, the second gun being kept in a stand-by location in pre-heat mode, ceasing deposition prior to achieving target thickness, shuttering each of the fixtures at different times, independently reopening the fixtures to a low rate pulsed deposition to achieve the target thickness, closing clam shutters on the fixtures, moving the first gun to a stand-by position, moving the second gun to the source deposition location, sampling evaporation with a quartz crystal thickness monitor, opening a shutter on the second gun, performing ion assisted evaporation with the second gun, the first gun being kept in a stand-by location in pre-heat mode, ceasing deposition prior to achieving target thickness, shuttering each of the fixtures at different times, independently reopening the fixtures to a low rate pulsed deposition to achieve the target thickness, closing clam shutters on the fixtures, and repeating the process until desired filter is obtained.

In accordance with another aspect of the present invention, a method for producing an optical filter utilizing line-of-sight deposition includes the steps of providing multiple substrates, providing a fixed ion source, providing at least one selectively movable evaporator, positioning the at least one evaporator at a source deposition location, and depositing material onto the substrates.

In accordance with still another aspect of the present invention, the method includes shuttering the substrates as necessary to ensure uniform deposition on the substrates.

In accordance with yet another aspect of the present invention, the method includes ceasing deposition of a layer prior to achieving target thickness, shuttering the substrates at different times, independently unshuttering the substrates, and achieving the target thickness.

In accordance with another aspect of the present invention, the method includes moving the first evaporator to a stand-by position, opening a shutter on the second evaporator, positioning the second evaporator at the source deposition location, performing ion assisted evaporation with the second evaporator, ceasing deposition of a layer prior to achieving target thickness, shuttering the substrates at different times, independently unshuttering the substrates, and achieving the target thickness.

In accordance with yet another aspect of the present invention, after moving the second evaporator into the source deposition location, the method includes sampling evaporation with a quartz crystal thickness monitor.

In accordance with still another aspect of the present invention, the method further includes the steps of closing clam shutters on the substrates, repeating the process until desired filter is obtained, and providing a dense high yield fixture array having multiple, independently shutterable fixtures, each of the fixtures containing multiple substrates.

In accordance with another aspect of the present invention, a system for producing optical filters includes multiple substrates, an ion source, at least two selectively movable evaporators, a source deposition location, shuttering means for shuttering the substrates, and a vacuum chamber.

In accordance with yet another aspect of the present invention, the substrates are attached to high yield fixtures, the fixtures being independently shutterable, the fixtures rotate and are adjustable, the evaporators are connected to a movable track, the movable track being opposite the fixtures in the vacuum chamber, and the vacuum chamber is approximately 60 inches wide by 60 inches deep by 80 inches high.

In accordance with another aspect of the present invention, the system includes a quartz crystal thickness monitor.

Still other benefits and advantages of the invention will become apparent to those skilled in the art upon a reading and understanding of the following detailed specification.

III. BRIEF DESCRIPTION OF THE DRAWINGS

The invention may take physical form in certain parts and arrangement of parts. At least one embodiment of these parts will be described in detail in the specification and illustrated in the accompanying drawings, which form a part of this disclosure and wherein.

IV. DESCRIPTION OF THE INVENTION

Figure 1A:
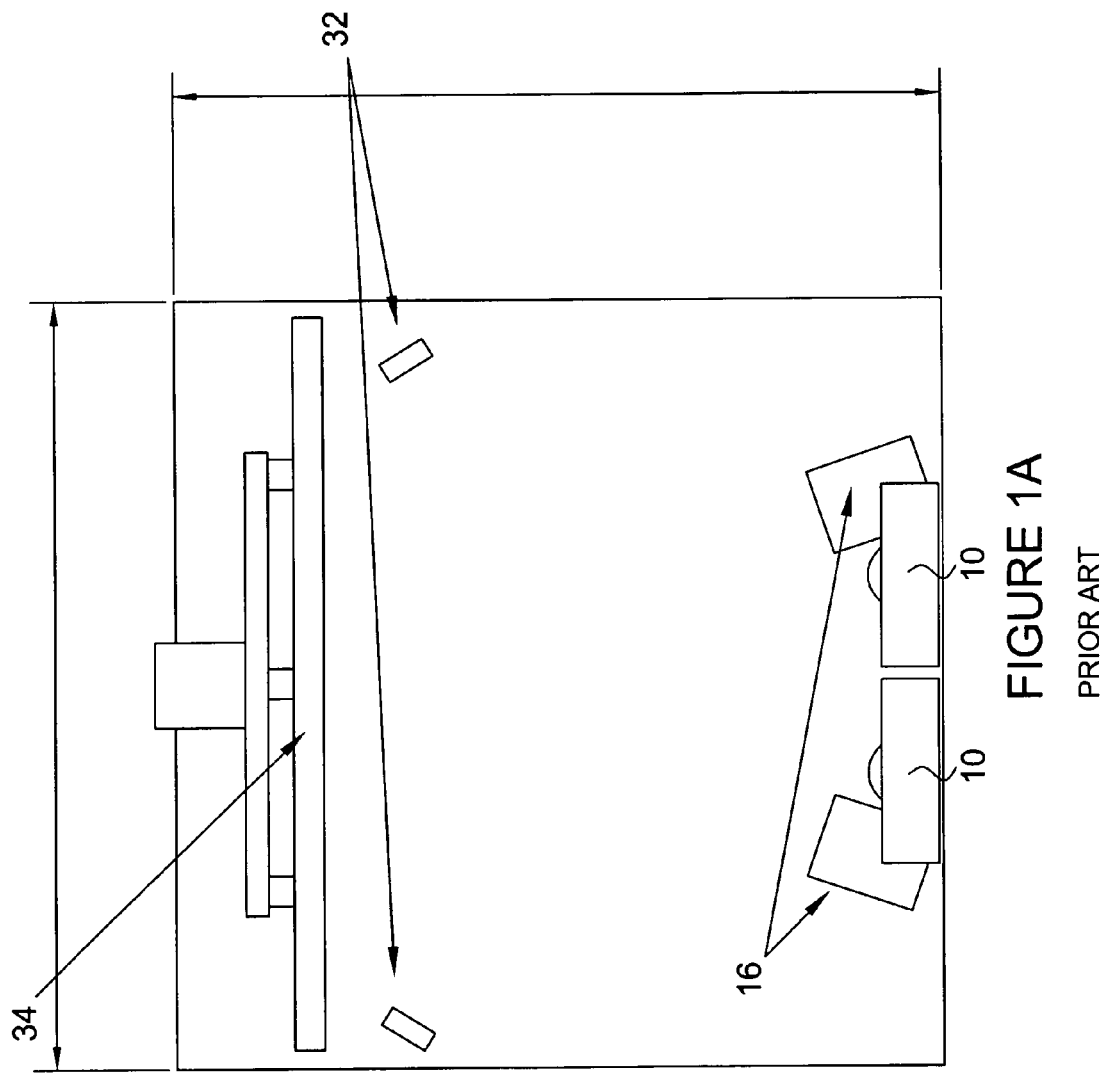
FIG. 1A shows a prior art box-style IAD coater.
Figure 1B:
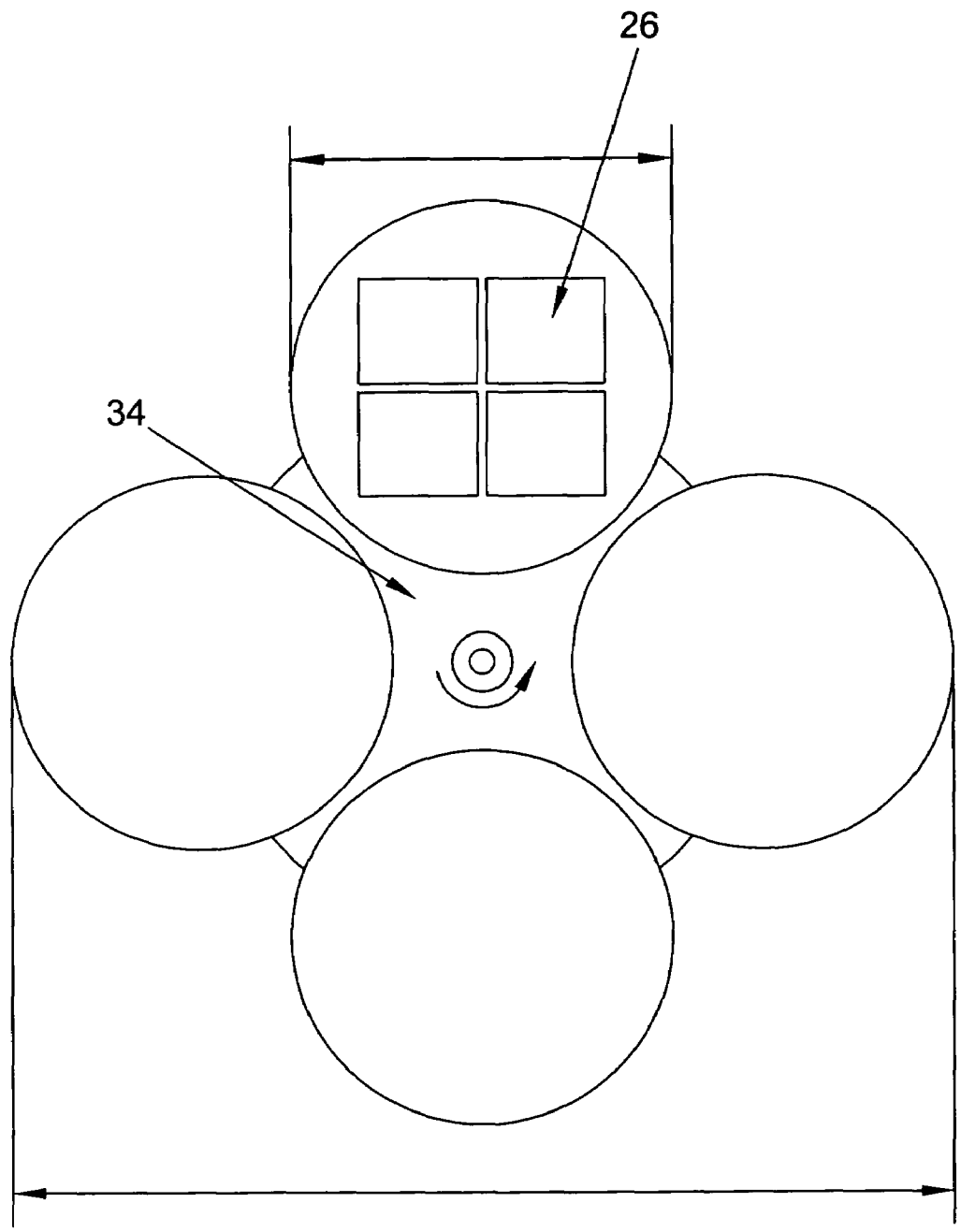
FIG. 1B shows a prior art planetary substrate assembly.
Figure 2A:
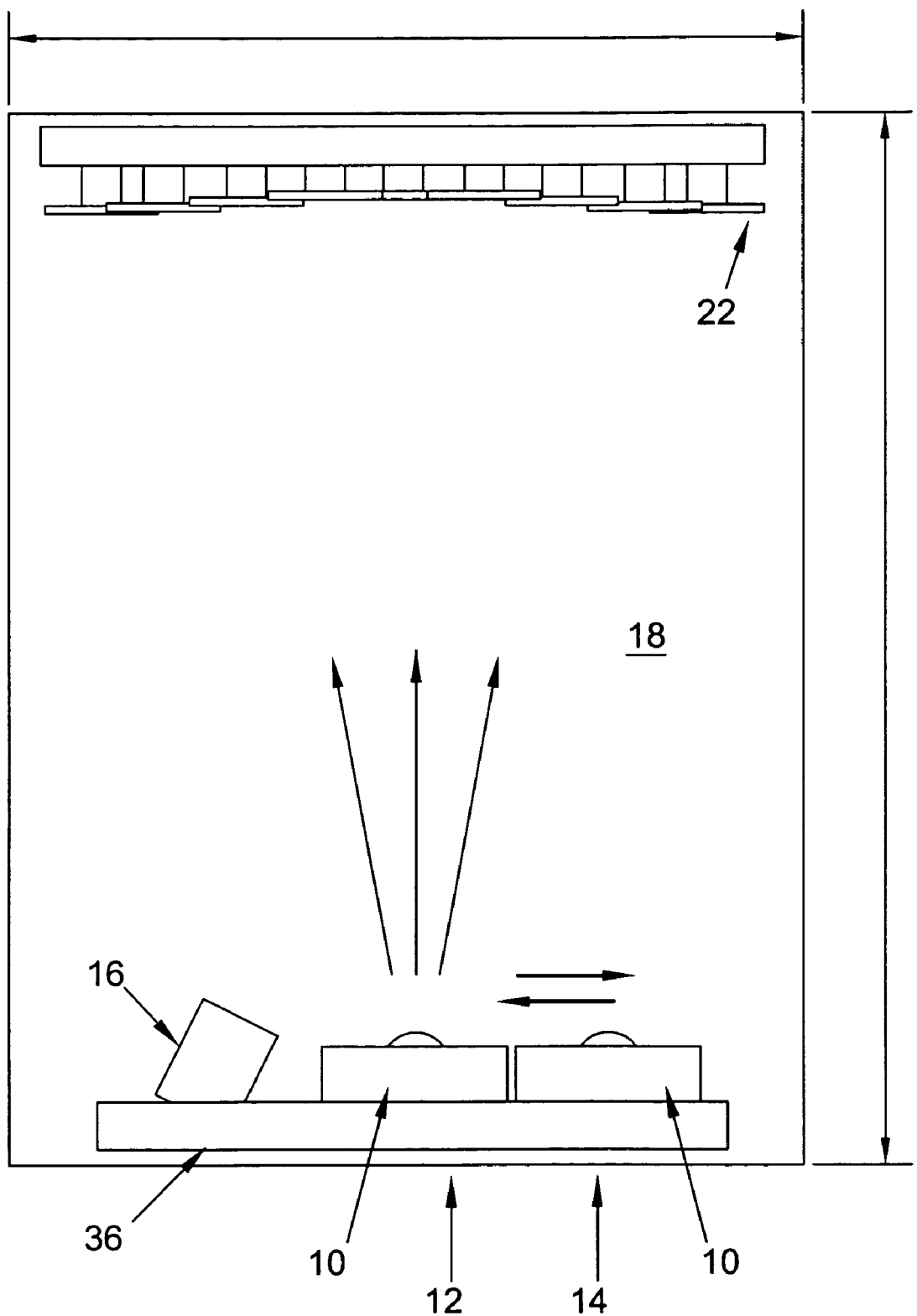
FIG. 2A shows one embodiment of the inventive deposition system with dual moveable e-beam evaporators; and, FIG. 2B shows one embodiment of the inventive dense high yield fixture array.

Referring now to the drawings, which are for purposes of illustrating at least one embodiment of the invention only, and not for purposes of limiting the invention, FIGS. 2A and 2B show the invention as described with reference to at least one embodiment.

FIGS. 2A and 2B show one embodiment of the inventive assembly, including evaporators 10, a source deposition location 12, a standby position 14, a fixed ion source 16, a vacuum chamber 18, fixed array 20, fixtures 22, substrate 26, disk 28, rotation mechanism 30, and QCM 32. The fixtures 22 are located in a dense high yield array 20, as shown in FIGS. 2A and 2B. The fixtures 22 are in close proximity to each other, in order to utilize as many substrates 26 as possible.

In one embodiment, an ion assisted electron beam evaporation system has been configured to produce narrow band pass filters for DWDM multiplexers with high throughput and maximum yield. The system significantly improves uniformity of coated substrates to enable increased output. The improvements to the conventional electron beam deposition system discussed herein can be implemented in any deposition system. For example, the improvements are suitable for high performance filters such as for DWDM.

The deposition system is shown schematically in FIG. 2A. With a dense array 20 of such fixtures 22, sufficient thickness uniformity is guaranteed on substrates 26 at every location in the deposition system. In this embodiment, it is preferable that the electron beam gun 10 remain near a central location, since the dense fixture array 20 does not rotate in a planetary fashion. The optimum location for maximum deposition uniformity must be selected for the position of the electron gun 10. This position is called the source deposition location 12.

As described earlier, for highest throughput, two electron guns 10 are preferred for a two material design. If the filter design incorporated more than 2 materials, it would be desirable to employ one electron gun 10 for every material used to produce the filter. However, it is to be understood that this invention will work with any number of guns 10, as long as chosen using sound engineering judgment.

As shown in FIG. 2A, the electron guns 10 are mounted to a movable track 36, which allows positioning of the operational gun 10 at the source deposition location 12. In this embodiment, the gun 10 performing deposition of an individual layer is positioned at the source deposition location 12 before evaporation from that gun 10 is initiated. During alternate layers, the gun 10 not in use is kept in a stand-by location 14 and in "pre-heat" mode. As a layer deposition is concluded, the gun 10 in stand-by 14 is quickly moved from the stand-by position 14 to the source deposition location 12 and the next layer is initiated. Translation from the stand-by location 14 to the source deposition location 12 can be performed in less than 2 seconds.

If the electron guns 10 operated flawlessly, then the source deposition location 12 would be the exact center of the chamber base plate (shown but not referenced). It is possible, in this embodiment, that the source deposition location 12 may be off-center. The moving track 36 allows the operator to determine the source deposition location 12 experimentally for each gun 10.

The deposition process would proceed in the following way. Fixtures 22 are positioned approximately as shown in FIGS. 2A and 2B. During system calibration, the vertical position of each fixture 22 is individually adjusted to compensate for variations in deposition rate vs. chamber location. In FIG. 2A, the array 20 is shown with the fixtures 22 having differing vertical positions.

Ion assisted evaporation is produced in the traditional fashion with the gun 10, containing the required layer material, positioned in the source deposition location 12. In this embodiment, the fixtures 22 rotate at approximately 1000 rpm or greater. However, it is to be understood that the fixtures can rotate as low as approximately 500 rpm as well. As the thickness of the individual layer approaches the target value as measured by the QCM 32, the clam shutter 38 closes prior to achieving the target thickness. Individual fixtures 22 are shuttered at different times, since like thicknesses are not achieved simultaneously, due to geometrical factors and nonuniform variations in deposition rate at different locations in the chamber 18.

Each fixture 22 is independently reopened to a low rate pulsed deposition process to achieve the target thickness. The low rate pulsed process utilizes a pulsed electron gun 10 while leaving the ion source 16 in full operating mode. The result is a uniform average deposition rate of approximately 0.025 mn/s and allows the layer thickness to be achieved on each fixture 22 independently. This process may take as much time as the initial "bulk" portion of the layer.

After completion of the layer all clam shutters 38 close and the electron gun 10 in the source deposition location 12 is shuttered and moves to the stand-by position 14. Simultaneously, the alternate gun 10 moves to the source deposition location 12 and the gun shutter (not shown) is opened. Each electron gun 10 uses a shuttered QCM (not shown) to sample evaporation before the clam shutters 38 are opened. The process is repeated until the desired filter is obtained. In one embodiment, total deposition time can range from 24–36 hours.

Obviously, modifications and alterations will occur to others upon a reading and understanding of the specification. It is intended by applicant to include all such modifications and alterations insofar as they come within the scope of the appended, claims or the equivalents thereof.

Having thus described several embodiments of the invention, it is now claimed.

We claim:

1. An ion-assisted electron beam evaporation process, the process comprising the steps of:
   positioning multiple high yield fixtures in an array;
   adjusting a vertical position of each of the fixtures to compensate for variations in deposition rate versus chamber location;
   providing two electron guns;
   mounting the guns to a movable track;
   moving the first gun to a source deposition location;
   rotating the fixtures at greater than 2400 rpm;
   performing ion assisted evaporation with the first gun, the second gun being kept in a first stand-by location in pre-heat mode;
   ceasing deposition prior to achieving target thickness on each fixture by shuttering each of the fixtures;
   independently reopening the fixtures to resume deposition at a low rate pulsed deposition to achieve the target thickness;
   closing shutters on the fixtures;
   moving the first gun to a second stand-by location;
   moving the second gun to the source deposition location;
   sampling evaporation with a quartz crystal thickness monitor;
   opening a shutter on the second gun;
   performing ion assisted evaporation with the second gun, the first gun being kept in the second stand-by location in pre-heat mode;
   ceasing deposition prior to achieving target thickness shuttering each of the fixtures;
   independently reopening the fixtures to resume deposition at a low rate pulsed deposition to achieve the target thickness;
   closing shutters on the fixtures; and
   repeating the process until desired filter is obtained.

2. A method for producing an optical filter utilizing line-of-sight deposition, the method comprising the steps of:
   providing multiple substrates;
   providing a fixed ion source;
   providing at least one selectively movable evaporator, the evaporator providing energy for evaporation of material to be deposited and being moveable between a source deposition location and a stand-by location spaced apart from the source deposition location;
   moving the at least one evaporator to the source deposition location; and,
   depositing material onto the substrates.

3. The method of claim 2, wherein the method further comprises the step of:
   shuttering the substrates as necessary to ensure uniform deposition on the substrates.

4. The method of claim 3, where in the method further comprises the step of:
   rotating the substrates at approximately greater than 500 revolutions per minute.

5. The method of claim 4, wherein shuttering the substrates as necessary to ensure uniform deposition on the substrates comprises the steps of:
   ceasing deposition of a layer prior to achieving target thickness by shuttering the substrates;
   independently unshuttering the substrates to resume deposition; and,
   achieving the target thickness.

6. The method of claim 2, wherein the at least one evaporator is at least two selectively movable evaporators, the method further comprising the steps of:
   moving the first evaporator to the stand-by location;
   opening a shutter on the second evaporator;
   moving the second evaporator to the source deposition location; and,
   performing ion assisted evaporation with the second evaporator.

7. The method of claim 6, wherein the method further comprises the steps of:
   ceasing deposition of a layer prior to achieving target thickness by shuttering the substrates;
   independently unshuttering the substrates to resume deposition; and,
   achieving the target thickness.

8. The method of claim 7, wherein after moving the second evaporator into the source deposition location, the method comprises the step of:
   sampling evaporation with a quartz crystal thickness monitor.

9. The method of claim 8, wherein the method further comprises the steps of:
   closing clam shutters on the substrates; and,
   repeating the process until desired filter is obtained.

10. The method of claim 9, wherein providing multiple substrates comprises the step of:
    providing a dense high yield fixture array having multiple, independently shutterable fixtures, each of the fixtures containing multiple substrates.

11. The method of claim 4, wherein rotating the substrates at greater than 500 revolutions per minute comprises the step of:
    rotating the substrates at greater than 2400 revolutions per minute.

12. A method of making an optical filter by ion assisted deposition comprising the steps of:
    mounting one or more substrates in a deposition chamber;
    mounting an ion source within the chamber;
    moving a first evaporator to a source deposition location within the chamber proximate the ion source, the first evaporator being adapted to provide energy for evaporation of a first material to be deposited;
    moving a second evaporator to a stand-by location within the chamber remote from the ion source, the second evaporator being adapted to provide energy for evaporation of a second material to be deposited;
    depositing a first material from the first evaporator on the one or more substrates;
    ceasing deposition of the first material;
    moving the first evaporator to a stand-by location within the chamber remote from the ion source;
    moving the second evaporator to the source deposition location;
    depositing a second material from the second evaporator on the one or more substrates; and
    ceasing deposition of the second material.

13. A method of making an optical filter by ion assisted deposition comprising the steps of:
    exposing one or more substrates to a first evaporator adapted to provide energy to evaporate a first material to be deposited positioned at a source deposition location;
    shielding the one or more substrates from a second evaporator positioned at a stand-by location laterally spaced from the source deposition location;
    depositing a layer of a first material on the one or more substrates;
    exposing the one or more substrates to the second evaporator adapted to provide energy to evaporate a second material to be deposited positioned at the source deposition location;
    shielding the one or more substrates from the first evaporator positioned at the stand-by location; and
    depositing a layer of second material on the one or more substrates.

14. A method comprising the steps of:
    providing a deposition chamber;
    positioning a generally planar substrate carrier proximate one end of the chamber, the substrate carrier being adapted to carry an array of substrates;
    positioning a generally planar electron gun carrier proximate the other end of the chamber, the electron gun carrier being substantially parallel to the substrate carrier;
    providing a source deposition location on the electron gun carrier;
    providing a stand-by location on the electron gun carrier, the stand-by location being spaced laterally from the source deposition location;
    positioning an electron gun on the electron gun carrier, the electron gun being adapted to provide energy for evaporation of material to be deposited on the substrates and being moveable between the source deposition location and the stand-by location; and
    positioning an ion source proximate the source deposition location.

15. The method of claim 14 wherein the ion source is mounted on the electron gun carrier.

16. The method of claim 14 further comprising the step of positioning a second electron gun on the electron gun carrier, the second electron gun being adapted to provide energy for evaporation of a second material to be deposited on the substrates and being moveable between the source deposition location and the stand-by location.

17. The method of claim 1 wherein the stand-by location is laterally spaced from the ion source a distance greater than the distance the source deposition location is spaced from the ion source.

* * * * *